(12) United States Patent
Fontana (10) Patent No.: US 9,374,926 B1
(45) Date of Patent: Jun. 21, 2016

(54) SYSTEMS AND METHODS FOR POWER CONVERSION AND DISTRIBUTION

(71) Applicant: General Electric Company, Schenectady, NY (US)

(72) Inventor: Edward Clark Fontana, Rockwall, TX (US)

(73) Assignee: General Electric Company, Schenectady, NY (US)

( * ) Notice: Subject to any disclaimer, the term of this patent is extended or adjusted under 35 U.S.C. 154(b) by 36 days.

(21) Appl. No.: 14/598,332

(22) Filed: Jan. 16, 2015

(51) Int. Cl.
*H05K 7/14* (2006.01)
*G06F 1/18* (2006.01)
*H05K 13/00* (2006.01)

(52) U.S. Cl.
CPC .............. *H05K 7/1492* (2013.01); *G06F 1/181* (2013.01); *G06F 1/189* (2013.01); *H05K 13/0023* (2013.01)

(58) Field of Classification Search
CPC ..... G06F 1/1601; G06F 1/181; G06F 1/1656; G06F 1/1671; G06F 1/187; G06F 2200/1631; G06F 2200/1638; G06F 2212/2112; G06F 12/1466; H01L 2224/75754; H01L 2224/80136; H01L 2224/80139; H01L 2224/81136; H01L 2224/81141; H01L 2224/83136; H01L 2224/84136; H05K 2201/2027; H05K 7/1448; H05K 7/1474; H05K 7/1492; H05K 13/0023
USPC ............................... 361/600–678; 307/11, 31
See application file for complete search history.

(56) References Cited

U.S. PATENT DOCUMENTS

| | | | |
|---|---|---|---|
| 4,922,172 A | 5/1990 | Roddy et al. | |
| 5,726,506 A * | 3/1998 | Wood | H02B 1/24 307/147 |
| 7,542,268 B2 * | 6/2009 | Johnson, Jr. | H05K 7/1492 174/50 |
| 7,551,456 B2 * | 6/2009 | Behrens | G06F 1/18 361/600 |
| 8,817,463 B1 * | 8/2014 | Rose | G06F 1/189 174/500 |
| 8,917,493 B2 * | 12/2014 | Wang | G06F 1/189 174/149 B |
| 2013/0293419 A1 | 11/2013 | Negus et al. | |
| 2014/0085801 A1 * | 3/2014 | Ning | H05K 7/1492 361/679.31 |
| 2014/0218844 A1 * | 8/2014 | Tseng | H05K 7/1492 361/679.01 |
| 2015/0177797 A1 * | 6/2015 | Butzer | G06F 1/26 713/300 |
| 2015/0277517 A1 * | 10/2015 | Zhang | G06F 1/189 361/622 |

FOREIGN PATENT DOCUMENTS

| WO | 2013055947 A1 | 4/2013 |
|---|---|---|
| WO | 2013090536 A1 | 6/2013 |

* cited by examiner

*Primary Examiner* — Zachary M Pape
(74) *Attorney, Agent, or Firm* — General Electric Company (57) ABSTRACT

A power conversion assembly configured to be mounted to an equipment rack is provided. The power conversion assembly includes a housing including at least one input power path extending from proximate a top end of the power conversion assembly to proximate a bottom end of the power conversion assembly, the at least one input power path configured to conduct input power, at least one output tap configured to distribute output power, and at least one receptacle configured to receive a power module and connect the power module to the at least one input power path and the at least one output tap, the power module configured to generate the output power from the input power.

20 Claims, 9 Drawing Sheets

SYSTEMS AND METHODS FOR POWER CONVERSION AND DISTRIBUTION

BACKGROUND

The field of the disclosure relates generally to power distribution systems, and more specifically, to a power conversion assembly for mounting to an equipment rack.

Large data processing centers (e.g., server farms) are used to perform data transactions such as, without limitation, storing, retrieving, and/or processing data, for companies and individuals all over the world. In particular, known data processing centers use computing devices, referred to herein as revenue producing devices, to perform data transactions on behalf of third parties in return for a fee. As the fee is typically based on the number of transactions performed, known data processing centers use large quantities of revenue producing devices to perform large quantities of data transactions.

Revenue producing devices may require a significant amount of power to operate. In particular, many data processing centers operate 24 hours a day 7 days a week, with the revenue producing devices using variable amounts of power. Power distribution to the revenue producing devices is further complicated by the fact that revenue producing devices generally require low-voltage direct current (DC) power (e.g., 12-54 volts DC) to operate, while the normal in building power distribution system utilizes high-voltage alternating current (AC) power (e.g., 208/480 volts AC).

In some known data processing centers, the high-voltage AC power is received by a main conversion hub that converts the high-voltage AC power to low-voltage DC power useable by the revenue producing devices. From the main conversion hub, the low-voltage DC power is routed to each rack and then to each revenue producing device. However, such systems have high copper content to overcome the significant resistive power losses caused by transmitting the low-voltage DC power over long distances throughout the data processing center. Furthermore, such systems can be susceptible to widespread power failure when the main conversion hub fails. Backup systems must be provided in either the form of redundant AC sources or battery reserves inside the system.

Other known data processing centers use integrated power racks having power equipment (e.g., without limitation, uninterruptable power supplies (UPS), AC/DC power converters, transformers, filters, and/or other power devices) housed in the rack. For these data processing centers, the high-voltage AC power is routed to each rack, and the power equipment inside the rack generates the low-voltage DC power used by the revenue producing devices within that rack. As the high-voltage AC power is routed to each rack, transmission costs are reduced as compared with the low-voltage DC transmission of a central hub. However, known integrated power racks may sacrifice between 4 and 8 U worth of space in the rack to accommodate the power conversion equipment (where a U is 1.75 inches of vertical space). Accordingly, integrating the power conversion within the rack will reduce the amount of revenue producing devices stored within each rack, which reduces the number of data transactions that can be performed by the data processing center. In addition, routing high-voltage AC power to the power equipment inside the rack can create additional safety hazards that must be mitigated through the use of covers and other devices. With the power conversion equipment located at a specific location within the rack, the low-voltage DC power must be run through the majority of the height of the rack using DC rails/bus bars. Accordingly, known integrated power racks have relatively long and expensive DC rails/bus bars with high resistive power losses.

BRIEF DESCRIPTION

In one aspect, a power conversion assembly configured to be mounted to an equipment rack is provided. The power conversion assembly includes a housing including at least one input power path extending from proximate a top end of the power conversion assembly to proximate a bottom end of the power conversion assembly, the at least one input power path configured to conduct input power, at least one output tap configured to distribute output power, and at least one receptacle configured to receive a power module and connect the power module to the at least one input power path and the at least one output tap, the power module configured to generate the output power from the input power.

In another aspect, a power conversion system is provided. The power conversion system includes an equipment rack comprising a plurality of rails, and a power conversion assembly mounted to at least one rail of the plurality of rails, the power conversion assembly including a housing. The housing includes at least one input power path extending from proximate a top end of the power conversion assembly to proximate a bottom end of the power conversion assembly, the at least one input power path configured to conduct input power, at least one output tap configured to distribute output power, and at least one receptacle. The power conversion system further includes at least one power module received in an associated receptacle of the at least one receptacle such that the at least one power module is connected to the at least one input power path and the at least one output tap, the at least one power module configured to generate the output power from the input power.

In yet another aspect, a method for assembling a power conversion system. The method includes mounting a power conversion assembly to at least one rail of an equipment rack, the power conversion assembly including a housing that includes at least one input power path configured to conduct input power and extending from proximate a top end of the power conversion assembly to proximate a bottom end of the power conversion assembly, at least one output tap configured to distribute output power, and at least one receptacle. The method further includes electrically coupling at least one power module to an associated receptacle of the at least one receptacle such that the at least one power module is connected to the at least one input power path and the at least one output tap, the at least one power module configured to generate the output power from the input power.

DETAILED DESCRIPTION

The embodiments described herein provide a power conversion assembly configured to be mounted in an equipment rack. The power conversion assembly includes at least one input power path that conducts input power, and at least one receptacle. The at least one receptacle is configured to receive power modules that convert the input power into output power. The power conversion assembly further includes at least one output tap that distributes the generated output power. The components of the power conversion assembly may be integrated within a single housing, or provided as separate modules that process the power in parallel, series, or when operating in a charge or backup state.

Figure 1:
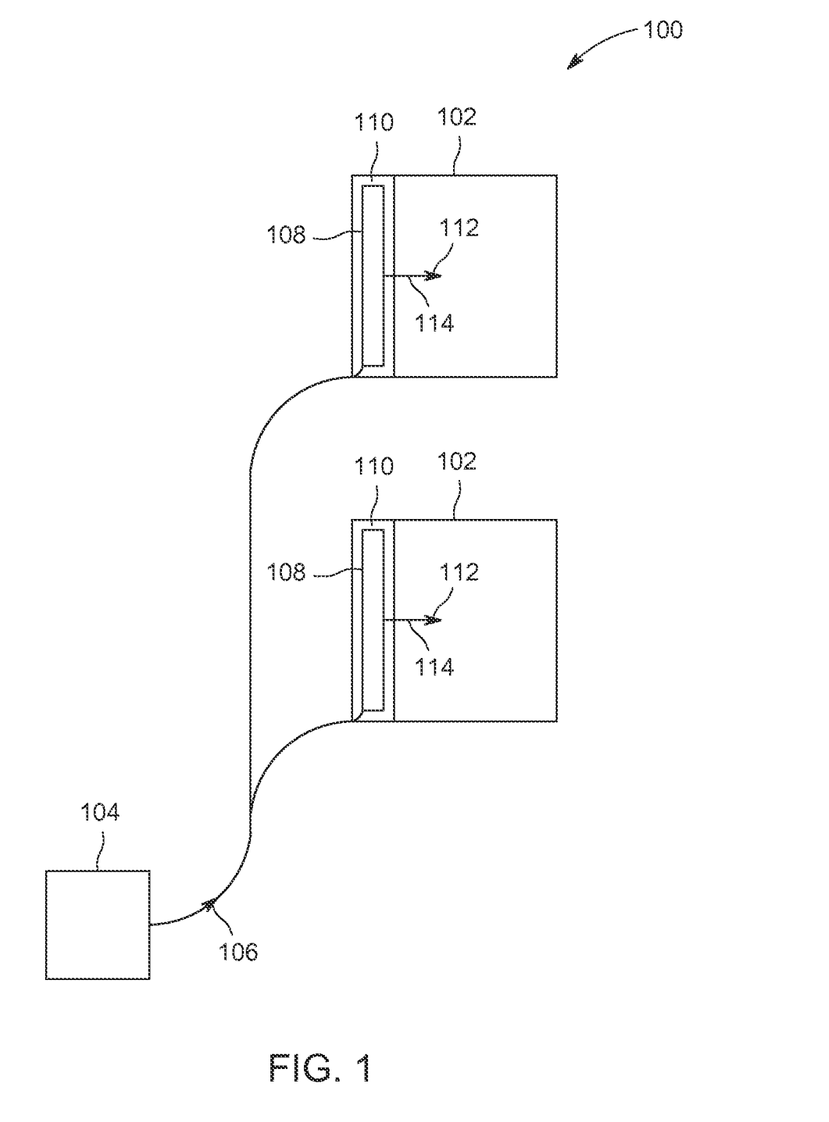
FIG. 1 is a block diagram of an exemplary data processing center.

FIG. 1 is a block diagram of an exemplary data processing center 100 for use in performing data transactions. In the exemplary embodiment, data processing center 100 includes a plurality of integrated equipment racks 102. Integrated equipment racks 102 are configured to be electrically coupled to an electrical power source 104 and to receive high-voltage alternating current (AC) power 106, directly from electrical power source 104. Electrical power source 104 is, for example, the commercial power grid, two independent grids, high voltage DC, or in some embodiments, low voltage DC. Alternatively, integrated equipment racks 102 may receive power from any power source that enables integrated equipment racks 102 to operate as described herein.

In the exemplary embodiment, each equipment rack 102 includes power equipment 108 spaced throughout a side power sub-compartment 110. Power equipment 108 is configured to convert high-voltage AC power 106 into low-voltage direct current (DC) power 112 and to provide low-voltage DC power 112 to at least one DC rail, or bus bar 114. DC rail 114 is configured to provide low-voltage DC power 112 to one or more loads.

Figure 2:
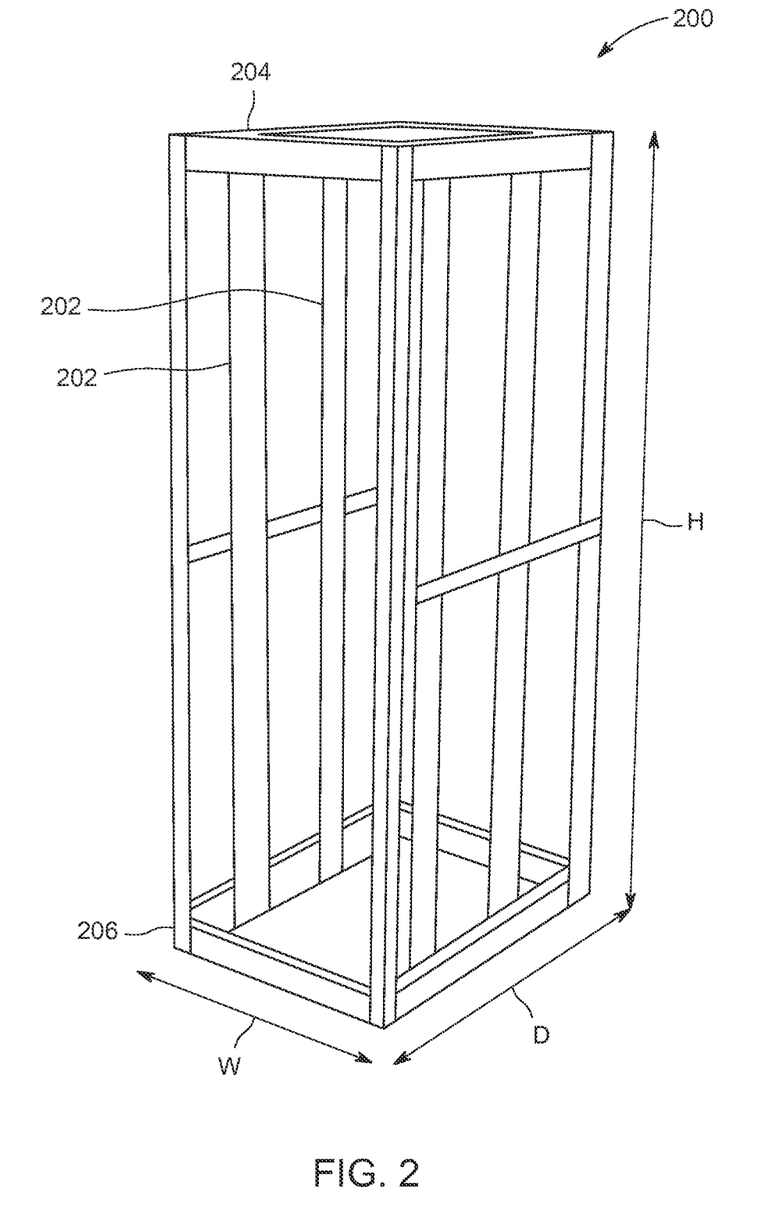
FIG. 2 is a perspective view of an exemplary equipment rack that may be used with the data processing center shown in FIG. 1.

FIG. 2 is a perspective view of an exemplary equipment rack 200 that may be used with data processing center 100 (shown in FIG. 1). Equipment rack 200 includes a plurality of rails 202. As shown in FIG. 2, equipment rack 200 includes a top end 204 and a bottom end 206. Equipment rack 200 has a height, H, extending from top end 204 to bottom end 206, a width, W, and a depth, D.

Figure 3:
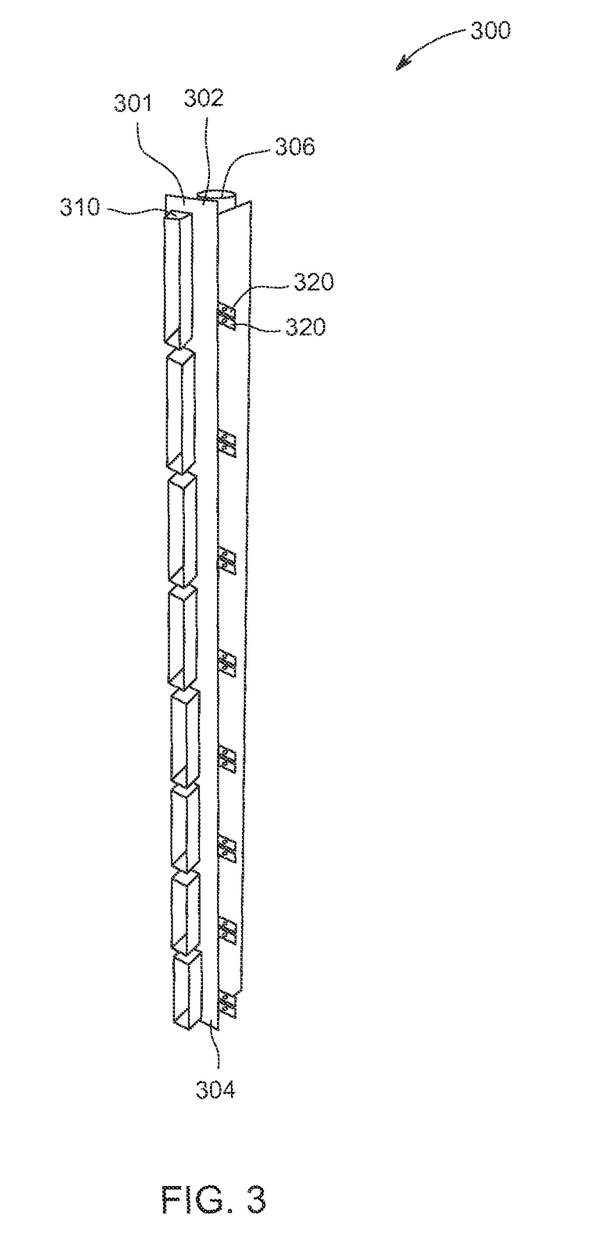
FIG. 3 is a perspective view of an exemplary power conversion assembly that may be used with the equipment rack shown in FIG. 2.
Figure 4:
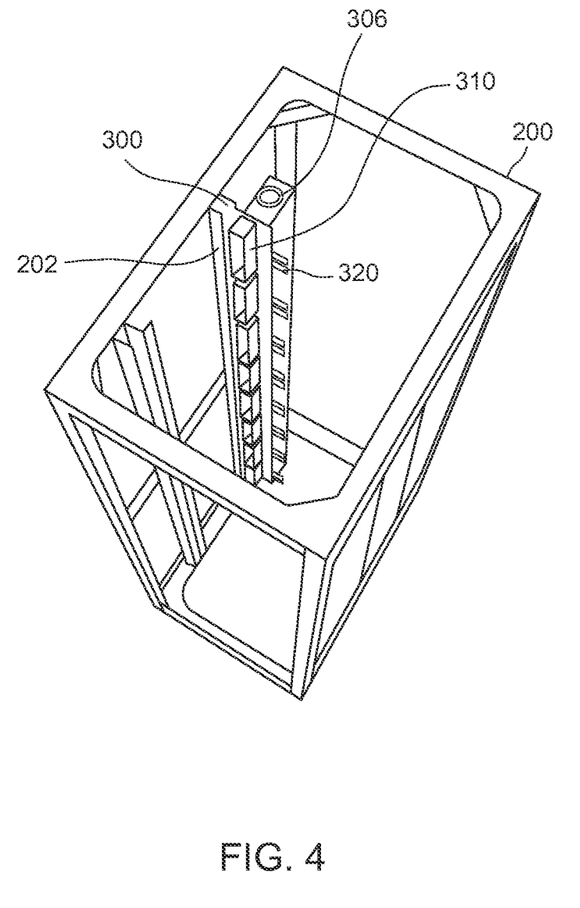
FIG. 4 is a perspective view of the power conversion assembly mounted to the equipment rack.

FIG. 3 is a perspective view of an exemplary power conversion assembly 300 that may be used with equipment rack 200 (shown in FIG. 2). FIG. 4 is a view of power conversion assembly 300 mounted to equipment rack 200. Specifically, as shown in FIG. 4, power conversion assembly 300 is mounted to one or more rails 202 using any suitable fastening devices. In the exemplary embodiment, power conversion assembly 300 is positioned between 23 inch and 19 inch rack rails of equipment rack 200.

Notably, power conversion assembly 300 is unitary assembly that integrates several power conversion components in a single, relatively easy to install, housing 301. That is, power conversion assembly 300 is configured to be mounted to different types and/or models of equipment racks, not only equipment rack 200. Accordingly, the advantages provided by power conversion assembly 300 may be realized by mounting power conversion assembly 300 to existing equipment racks. That is, power conversion assembly 300 separates power conversion electronics from the equipment rack design such that parties can simply install power conversion assembly 300 in equipment rack 200 without having to run additional wiring in equipment rack 200.

In operation, power conversion assembly 300 receives high-voltage AC power 106 from electrical power source 104 and converts high-voltage AC power 106 into low-voltage DC power 112 (all shown in FIG. 1). Power conversion assembly 300 has a height approximately equal to the height H of equipment rack 200. Accordingly, when mounted to equipment rack 200, power conversion assembly 300 extends from equipment rack top end 204 to equipment rack bottom end 206. In some embodiments, as described in detail below, a shorter version of the power conversion assembly 300 may be utilized to serve a zone of equipment rack 200, instead of the entire equipment rack 200.

Power conversion assembly 300 includes a top end 302 and a bottom end 304. An input power path 306 or wireset routes from top end 302 or bottom end 304. In the exemplary embodiment, input power path 306 is an AC power path that conducts AC power received from an AC power source, such as electrical power source 104 (shown in FIG. 1). Alternatively, input power path 306 may conduct DC power in some embodiments. Input power path 306 may receive power at top end 302 or bottom end 304. Further, in some embodiments, input power path 306 includes wire pigtails with connectors (neither shown) on one of top end 302 or bottom end 304. In the exemplary embodiment, the AC power is 480 Volt AC power. Alternatively, the power may be any magnitude of AC power, DC power, or combination of both that enables power conversion assembly 300 to function as described herein. For example, in some embodiments, the power may be a combination of multiple AC power sources, or AC sources and DC sources, with some of the sources backed up with battery reserves. In the exemplary embodiment, input power path 306 is a 2 inch diameter conduit rated to conduct 100 amps (A). Alternatively, input power path 306 may have any suitable specifications that enable power conversion assembly 300 to function as described herein, including items such as circuit breakers, auxiliary outlets, or surge protection devices. In some embodiments, power conversion assembly 300 includes perforations to facilitate ventilation for the various power components.

Power conversion assembly 300 further includes a plurality of receptacles 310 for connecting one or more power modules to input power path 306. Each receptacle 310 is configured to receive an associated power module (not shown in FIG. 3). In the exemplary embodiment, receptacles 310 receive rectifiers that convert AC power from input power path 306 into DC power. For example, rectifiers may be true three-phase 6 kilowatt (kW) rectifiers that draw balanced current from each of three phase conductors operating in a range from 380 to 480 VAC. Alternatively, for example, the rectifiers may be single phase converters, drawing power phase to phase or phase to neutral (e.g., in a range from 200 to 277 VAC). Further, in some embodiments, at least some receptacles 310 receive other types of power modules. For example, in some embodiments power may cascade from one module to another, or be combined in one module and delivered to equipment rack 200 or to another module. Some modules may be, for example, energy storage modules with battery charge and discharge functions at low or high voltages. Communication between modules may include reserve or standby power, as well as information. Further, in some embodiments, a server may facilitate optimizing efficiency of power modules at a low load by reducing voltages based on a least low voltage tolerant subsystem in the server. In the exemplary embodiment, power conversion assembly 300 includes eight receptacles 310. Alternatively, power conversion assembly 300 may include any number of receptacles 310 that enables power conversion assembly 300 to function as described herein.

A plurality of output taps 320 are provided on power conversion assembly 300 in the exemplary embodiment. A set of output taps 320 is can be connected to an associated power module at each receptacle 310. Each set of output taps 320 provide output power from an associated power module to one or more loads (not shown) housed in equipment rack 200. Output taps 320 facilitate delivering output power at whatever height is desired. In the exemplary embodiment, the output power is nominal 12 Volt DC power. Alternatively, the output power may be any magnitude of DC or AC power that enables power conversion assembly 300 to function as described herein. For example, the output voltage could be in a range from 6 to 60 VDC, or ever 380 VDC in some embodiments. In some embodiments, power conversion assembly 300 includes circuit breakers (not shown) coupled to output taps 320 for protection purposes. Further, in some embodiments, the power outputs provided by output taps 320 may be partitioned (e.g., by providing a common DC bus for each third of the height of equipment rack 200).

Figure 5:
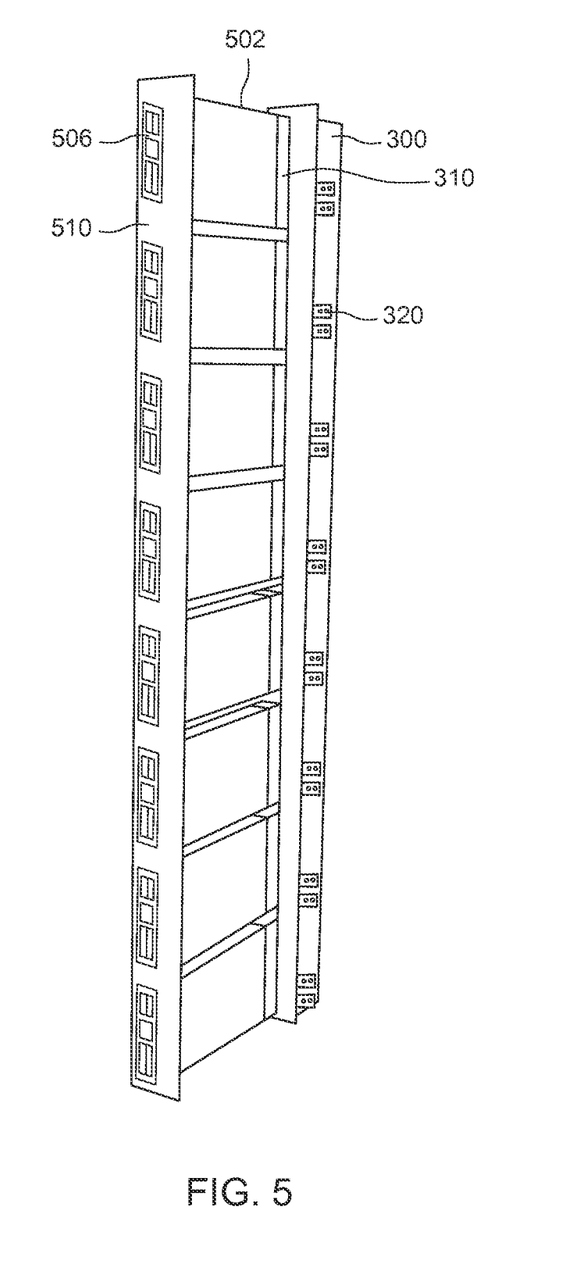
FIG. 5 is a perspective view of the power conversion assembly electrically coupled to a plurality of exemplary power modules.
Figure 6:
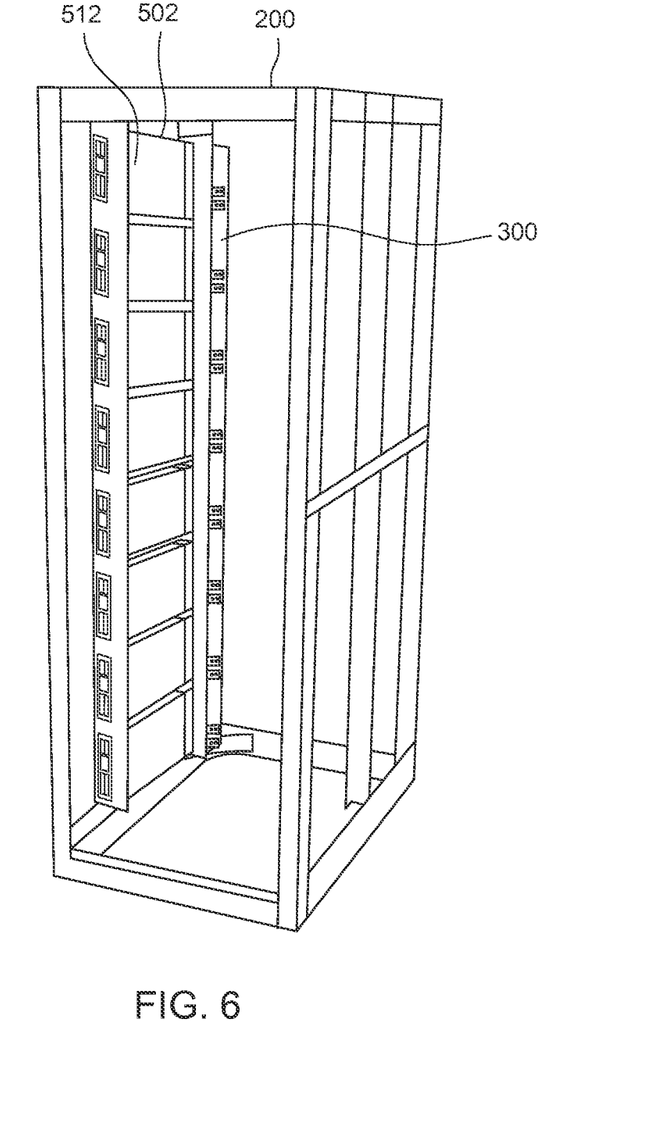
FIG. 6 is a perspective view of the power conversion assembly, the plurality of power modules, and the equipment rack.
Figure 7:
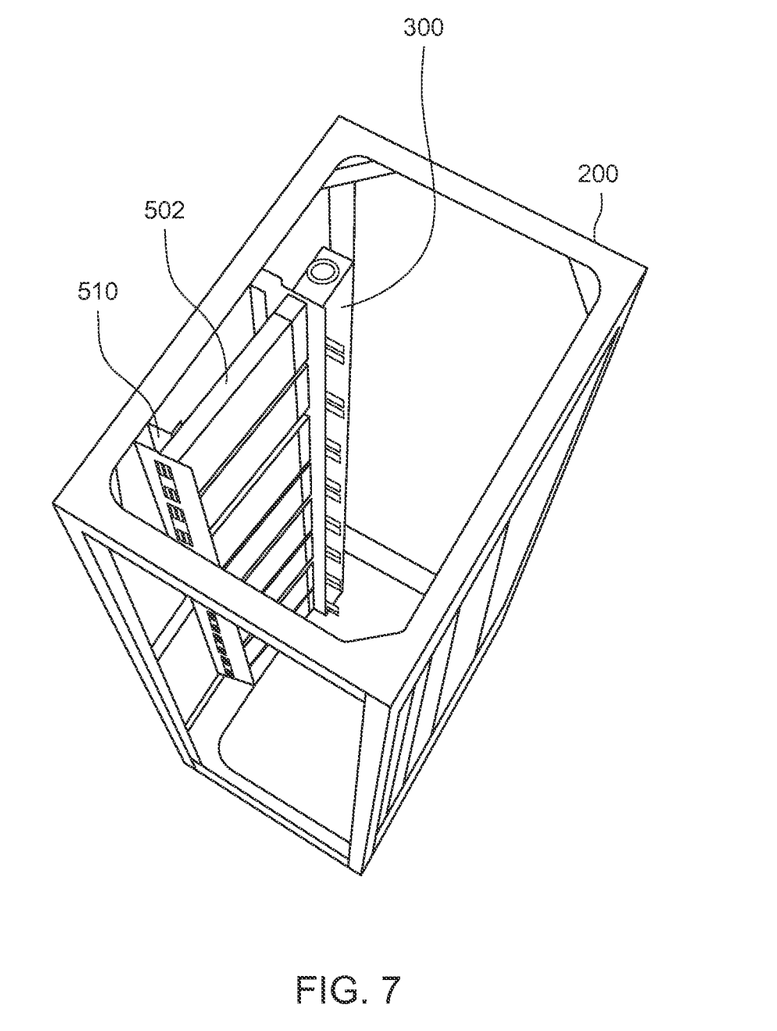
FIG. 7 is a perspective view of the power conversion assembly, the plurality of power modules, and the equipment rack.

FIG. 5 is a perspective view of power conversion assembly 300 electrically coupled to a plurality of power modules 502. FIGS. 6 and 7 are perspective views of equipment rack 200, power conversion assembly 300, and power modules 502. As explained above, each power module 502 is received in an associated receptacle 310. Further, as explained above, in the exemplary embodiment, power modules 502 convert AC power from input power path 306 into DC power for delivery to one or more loads.

As shown in FIG. 5, each power module 502 includes a first end 504 received in an associated rectifier receptacle 310, and a second end 506 received in an alignment plate 510. Alignment plate 510 facilitates aligning power module 502 relative to receptacles 310 and equipment rack 200. Alignment plate 510 may be mounted to a rail 202 of equipment rack 200 using any suitable fastening devices. Alternatively, alignment plate 510 may be integrated into equipment rack 200, eliminating the need for a discrete alignment plate component. Further, each power module 502 may include a guide shroud, or housing 512 that encloses the wiring and electrical components of power modules 502.

Figure 8:
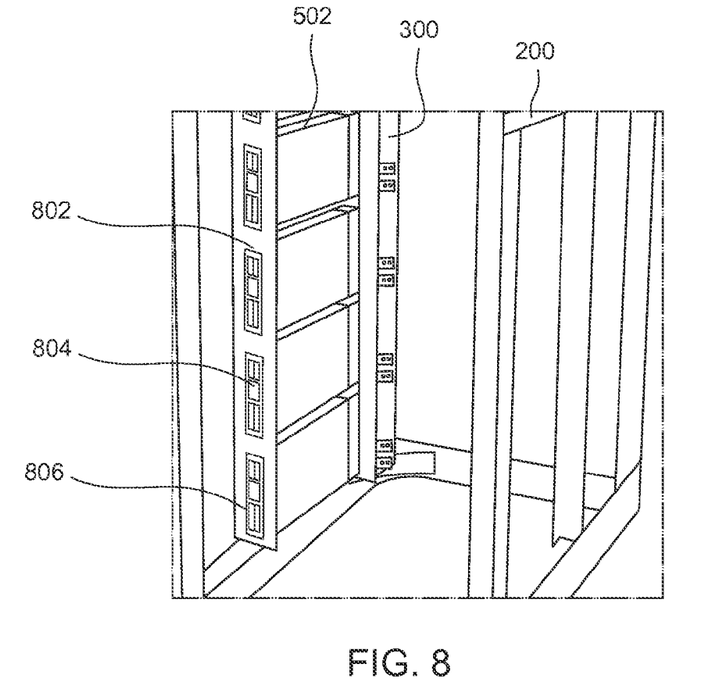
FIG. 8 is a perspective view of a portion of the power conversion assembly, the plurality of power modules, and the equipment rack.

FIG. 8 is a perspective view of a portion of equipment rack 200, power conversion assembly 300, and power modules 502. As shown in FIG. 8, each power module 502 includes a set 802 of light emitting diodes (LEDs). In the exemplary embodiment, each LED set 802 includes a first LED indicating the status of AC, or input power, a second LED indicating the status of DC, or output power, and a third LED indicating the status of power module 502 itself (e.g., whether power module 502 has faulted). Alternatively, power modules 502 may include any suitable type and/or number of indicators that signify operation of power modules 502. Each power module 502 also includes an inventory control label 804 and a lever 806 for selectively ejecting the contents of power module 502 from housing 512.

In some embodiments, design tolerances between power modules 502 and receptacles 310 are tighter than design tolerances for equipment rack 200. Accordingly, in some situations, when alignment plate 510 and power conversion assembly 300 are mounted to respective rails 202, a power module 502 may be undesirably offset with respect to an associated receptacle 310. To remedy this, a registration or alignment bar that sets the location of power module 502 with respect to receptacles 310 may be utilized.

Figure 9:
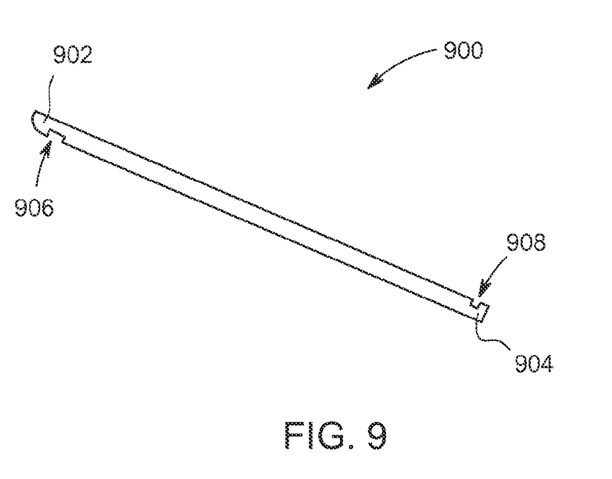
FIG. 9 is a perspective view of an exemplary alignment bar that may be used with the power conversion assembly shown in FIG. 3.

For example, FIG. 9 is a perspective view of an exemplary alignment bar 900 that extends from a first end 902 to a second end 904. First end 902 includes a first receptacle 906 that registers to power conversion assembly 300, and second end 904 includes a second receptacle 908 that registers to a faceplate of an associated power module 502. In the exemplary embodiment, alignment bar 900 is positioned within housing 512 of an associated power module 502.

Power conversion assembly 300 provides several advantages over existing power conversion architectures. For example, at least some known power conversion architectures require 120-240 VAC power supplies and/or require handling of 480 VAC by data processing equipment suppliers or equipment rack suppliers. Power conversion assembly 300 eliminates both of these requirements, moving the 480 VAC power closer to the loads. By providing a local to the load one-step conversion from 480 VAC to load suitable VDC, power conversion assembly reduces power (i.e., $I^2R$) losses.

Further, power conversion assembly 300 eliminates the need to bus 12.5 VDC up or down the height of equipment rack 200. Instead, 480 VAC is bussed along input power path 306, and is converted to 12.5 VDC by power modules 502 in the exemplary embodiment. Moreover, power conversion assembly 300 is relatively compact, and can be implemented relatively easily in existing equipment racks. For example, in the exemplary embodiment, power conversion assembly 300 occupies approximately $1/16^{th}$ of the total volume of equipment rack 200.

Figure 10:
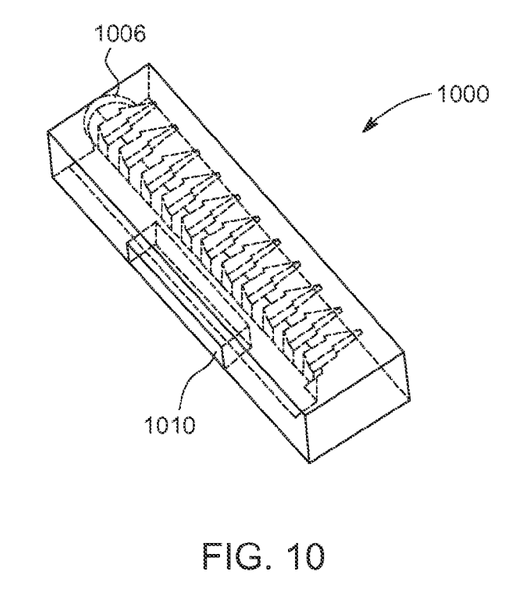
FIG. 10 is a perspective view of an alternative power conversion assembly that may be used with the equipment rack shown in FIG. 2.

FIG. 10 is a perspective view of an alternative power conversion assembly 1000. In contrast to power conversion assembly 300, power conversion assembly 1000 is substantially shorter, and includes only a single receptacle 1010 electrically coupled to an input power path 1006. For example, power conversion assembly 1000 may have a height of approximately 20 inches. Power conversion assembly 1000 may be used, for example, to facilitate power conversion for only a fraction of equipment rack 200, as opposed to the entire equipment rack 200.

Figure 11:
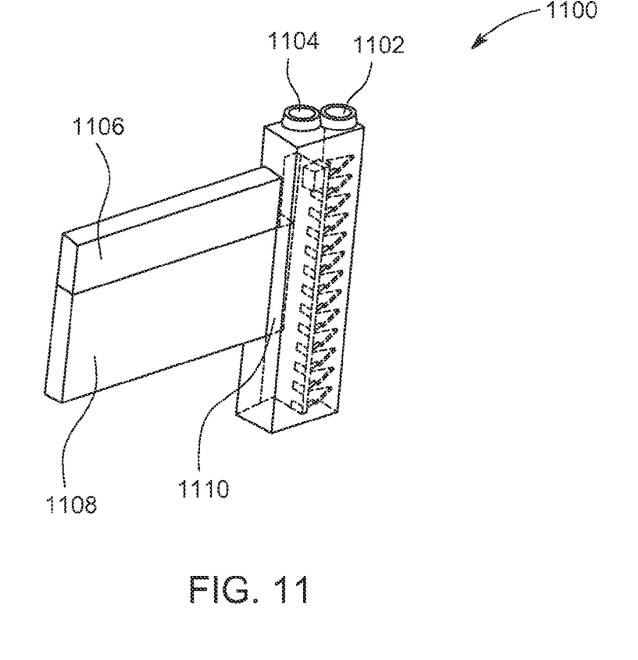
FIG. 11 is a perspective view of an alternative power conversion assembly that may be used with the equipment rack shown in FIG. 2.

FIG. 11 is a perspective view of yet another alternative power conversion assembly 1100. Similar to power conversion assembly 1000, power conversion assembly 1100 is relatively short. However, power conversion assembly 1000 includes a first input power path 1102 and a second input power path 1104. Further, in this embodiment, a first module 1106 and a second module 1108 are electrically coupled to a receptacle 1110. In operation, first module 1106 receives two inputs (i.e., one from each of first and second input power paths 1102 and 1104), with one input designated as a primary input and the other input designated as a secondary input. When the primary input isn't available, first module 1106 uses the secondary input instead, and returns to using the primary input when it again becomes available. Switching between the primary and secondary inputs, first module 1106 provides a continuously available input power stream to second module 1108. First and second modules 1106 and 1108 could, of course, be combined into a single module. The inputs could be AC or DC, and be high or low voltage.

Although described above with respect to specific power conversion configurations and equipment rack configurations, the present disclosure contemplates that additional configurations may be understood to one of ordinary skill in the art in view of the disclosure. Features of any of the described embodiments may be included with features of any other embodiment such that the systems and methods function as described herein.

Exemplary embodiments of systems and methods for power conversion and distribution are described herein. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the systems described herein.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A power conversion assembly configured to be mounted to an equipment rack, said power conversion assembly comprising:
    a housing comprising:
        at least one input power path extending from proximate a top end of said power conversion assembly to proximate a bottom end of said power conversion assembly, said at least one input power path configured to conduct input power;
        at least one output tap configured to distribute output power; and
        at least one receptacle configured to receive a power module and connect the power module to said at least one input power path and said at least one output tap, the power module configured to generate the output power from the input power.

2. A power conversion assembly in accordance with claim 1, wherein said at least one receptacle includes a plurality of receptacles.

3. A power conversion assembly in accordance with claim 1, wherein said at least one input power path is sized to extend from proximate a top end of the equipment rack to proximate a bottom end of the equipment rack.

4. A power conversion assembly in accordance with claim 1, wherein said at least one input power path is configured to conduct 480 VAC power.

5. A power conversion assembly in accordance with claim 1, wherein said at least one input power path is configured to receive the input power at one of said top end and said bottom end of said power conversion assembly.

6. A power conversion assembly in accordance with claim 1, wherein said at least one output tap is configured to distribute 12.5 VDC power.

7. A power conversion system comprising:
    an equipment rack comprising a plurality of rails;
    a power conversion assembly mounted to at least one rail of said plurality of rails, said power conversion assembly comprising:
        a housing comprising:
            at least one input power path extending from proximate a top end of said power conversion assembly to proximate a bottom end of said power conversion assembly, said at least one input power path configured to conduct input power;
            at least one output tap configured to distribute output power; and
            at least one receptacle; and
        at least one power module received in an associated receptacle of said at least one receptacle such that said at least one power module is connected to said at least one input power path and said at least one output tap, said at least one power module configured to generate the output power from the input power.

8. A power conversion system in accordance with claim 7, wherein said at least one input power path is configured to conduct 480 VAC power.

9. A power conversion system in accordance with claim 7, wherein said at least one input power path extends from proximate a top end of said equipment rack to proximate a bottom end of said equipment rack.

10. A power conversion system in accordance with claim 7, further comprising a server configured to improve efficiency of said at least one power module by reducing a voltage of the output power.

11. A power conversion system in accordance with claim 7, wherein said at least one input power path is configured to receive the input power at one of said top end and said bottom end of said power conversion assembly.

12. A power conversion system in accordance with claim 7, wherein said at least one output tap is configured to distribute 12.5 VDC power.

13. A power conversion system in accordance with claim 7, wherein said at least one power module comprises a three-phase rectifier.

14. A power conversion system in accordance with claim 7, further comprising an alignment bar coupled to said at least one power module, said alignment bar operable to align said at least one power module relative to said power conversion assembly.

15. A method for assembling a power conversion system, said method comprising:
- mounting a power conversion assembly to at least one rail of an equipment rack, the power conversion assembly including a housing that includes:
  - at least one input power path configured to conduct input power and extending from proximate a top end of the power conversion assembly to proximate a bottom end of the power conversion assembly, at least one output tap configured to distribute output power, and at least one receptacle; and
- electrically coupling at least one power module to an associated receptacle of the at least one receptacle such that the at least one power module is connected to the at least one input power path and the at least one output tap, the at least one power module configured to generate the output power from the input power.

16. A method in accordance with claim 15, further comprising, coupling an alignment plate to the equipment rack and the at least one power module, the alignment plate operable to align at least one power module relative to the equipment rack.

17. A method in accordance with claim 15, wherein mounting a power conversion assembly comprises mounting the power conversion assembly to the equipment rack such that the at least one input power path extends from proximate a top end of the equipment rack to proximate a bottom end of the equipment rack.

18. A method in accordance with claim 15, wherein electrically coupling at least one power module comprises electrically coupling at least one three-phase rectifier to an associated receptacle of the at least one receptacle.

19. A method in accordance with claim 15, wherein mounting a power conversion assembly comprises mounting a power conversion assembly that includes at least one input power path configured to conduct 480 VAC.

20. A method in accordance with claim 15, wherein mounting a power conversion assembly comprises mounting a power conversion assembly that includes at least one output tap configured to distribute 12.5 VDC.

* * * * *